United States Patent [19]

Su

[11] Patent Number: 5,164,954
[45] Date of Patent: Nov. 17, 1992

[54] WAVELENGTH-TUNABLE TRAVELING-WAVE SEMICONDUCTOR RING-LASER

[75] Inventor: Chin Su, College Station, Tex.

[73] Assignee: The Texas A&M University System, College Station, Tex.

[21] Appl. No.: 697,710

[22] Filed: May 9, 1991

[51] Int. Cl.⁵ .............................................. H01S 3/083
[52] U.S. Cl. ...................................... 372/94; 372/92; 372/20
[58] Field of Search ................... 372/94, 102, 92, 105, 372/20, 21, 22

[56] References Cited

U.S. PATENT DOCUMENTS

| | | | |
|---|---|---|---|
| 4,194,168 | 3/1980 | Jarrett et al. | 372/105 |
| 4,229,710 | 10/1980 | Shoshan | 372/102 |
| 4,706,253 | 11/1987 | Chin | 372/44 |
| 5,022,033 | 6/1991 | Hackell | 372/94 |
| 5,029,179 | 7/1991 | Harrison | 372/94 |
| 5,050,183 | 9/1991 | Duling, III | 372/94 |

Primary Examiner—William L. Sikes
Assistant Examiner—S. W. Barns
Attorney, Agent, or Firm—Baker & Botts

[57] ABSTRACT

A traveling-wave ring-laser (10) to provide improved power stability single longitudinal mode characteristics, narrow lasing linewidth and smooth wavelength tuning. The ring-laser comprises an optical amplifier (12) that includes a first facet (16) and a second facet (42). Optical amplifier (12) generates laser light from first facet (16) ring-laser (10) directs a portion of the laser light from first facet (16) back into second facet (42). An Faraday rotator (32) and half-wave plate (30) direct a portion of laser light that second facet (42) receives to travel in one direction only from first facet (16) to second facet (42). By feeding back input from optical amplifier (12) first facet 16 into second facet 42, lasing occurs. Causing laser light from first facet (16) to travel in one direction provides for smooth wavelength tuning and stable power performance single longitudinal mode and narrow-linewidth characteristics in laser system (10). A wavelength selective grating (36) associates with ring-laser system (10) to permit wavelength tuning by mechanical varying grating angle of mechanical grating (36). The traveling-wave ring-laser system (10) has applications in fiber optic communications, high-resolution spectroscopy, optical recording and optical readout second harmonic wavelength conversion processes microwave and millimeter wave generation, and picosecond pulse generation, and fiber sensor application.

30 Claims, 4 Drawing Sheets

WAVELENGTH (nm)

WAVELENGTH (nm)

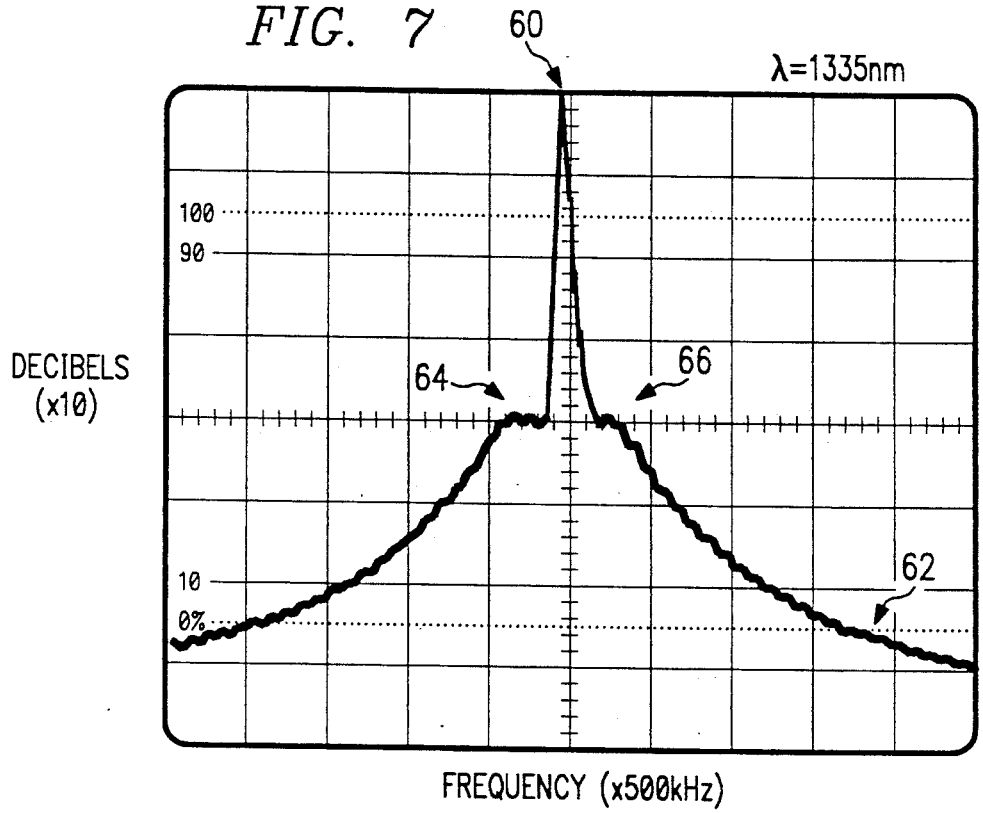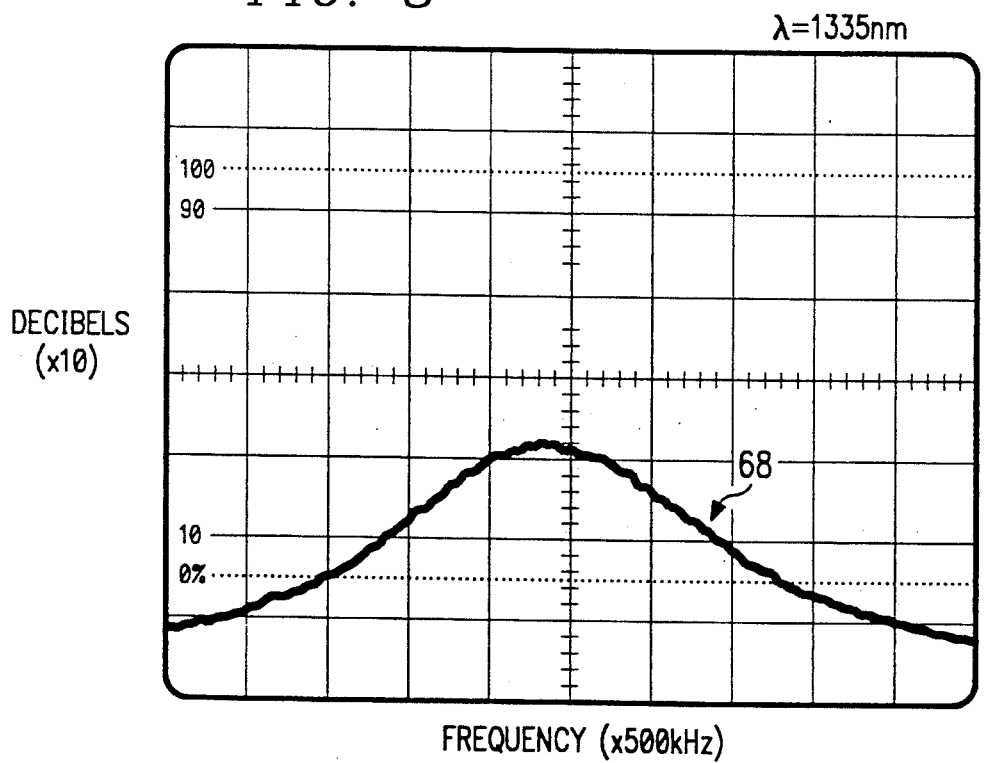

WAVELENGTH-TUNABLE TRAVELING-WAVE SEMICONDUCTOR RING-LASER

This invention was made with Government support under contract #F19628-89-K-0024 awarded by Air Force Systems Command, U.S. Air Force. The Government has certain rights in the invention.

TECHNICAL FIELD OF THE INVENTION

The present invention is directed to wavelength-tunable, high-power semiconductor lasers and more particular to a traveling-wave semiconductor ring-laser exhibiting smooth wavelength tuning and performance stability, as well as high-power, narrow-linewidth, and single-wavelength operational characteristics.

BACKGROUND OF THE INVENTION

For a variety of applications, lasers must exhibit single longitudinal mode, narrlow lasing linewidth smooth wavelength tuning and power stability. These applications include fiber optic communications, high-resolution spectroscopy, optical recording and optical readout, microwave and millimeter wave generation. Semiconductor lasers, to be useful for these applications, must be capable of providing not only smooth wavelength tuning and operational stability, but also high-power, narrow-linewidth, and single-wavelength characteristics. The conventional standing-wave semiconductor lasers, however, do not satisfy these requirements. Because of their economy and reliability, however, it would be commercially attractive to use semiconductor lasers for these applications.

As local oscillators for fiber optic communications and high-resolution spectroscopy, lasers providing smooth wavelength tuning and narrow-linewidth, single-wavelength performance are desirable. See T. Okoshi, "Recent Advances in Coherent Optical Fiber Communication Systems," Journal of Lightwave Technology, Vol. LT-5 pp. 44–52 (1987). Narrow-linewidth and smooth wavelength tuning characteristics provide the capability for tuning the laser to the resonance transition. Also, fiber optic communications involving testing of optoelectronic devices need lasers that provide a wavelength tunable characteristics. See H. Sasada, "1.5 Micron DFB Semiconductor Laser Spectroscopy of HCN," J. Chemical Phys., Vol. 88, pp. 767–777 (1988).

Systems that employ optical recording and optical readout technology, use solid state lasers which emit visible light by a process known as second harmonic conversion. See W. J. Kozlovsky and W. Lenth, "Generation of 41 mW of Blue Radiation by Frequency Doubling of a GaAlAs Diode Laser, App. Phys. Lett., Vol 56, pp. 2291-2 (1990)". Second harmonic conversion is a desirable process, because of its potential for producing short wavelength light. Short wavelength light has the ability to provide improved information storage capacity for optical recording relative to longer wavelength light. Second harmonic conversion achieves a shorter wavelength by optically pumping a solid state material (e.g., Potassium Niobate ($KNbO_3$)) with a high-powered infrared semiconductor laser. The improved information storage capacity of light produced by second harmonic conversion has commercial applications and may make possible more advanced research in optical recording and optical readout.

Another use for wavelength-tunable lasers is in microwave and millimeter wave signal generation. See L. Goldberg, A. M. Yurek, H. F. Taylor and J. F. Weller, 35 GHz Microwave Signal Generation with an Injection Locked Laser Diode" Electron Lett., 21, pp. 714–815, (1985). By mixing lasing light from two laser devices, a third microwave or millimeter wave frequency signal may be generated. Generation of the radio frequency signal in this way, however, requires coherent laser radiation with high stability and wavelength tuning smoothness for quality high frequency signal generation. Known systems for use in microwave and millimeter wave signal generation have substantial room for improvement in both smooth wavelength tuning and performance stability.

A further application for lasers that provide smooth wavelength tuning characteristics is in fiber sensors. If a laser provides a minimum nonlinear gain, it may be useful for picosecond pulse generation applications in fiber sensors. A use for this type of device may be, for example, as a component for high-speed sampling oscilloscopes.

Semiconductor lasers have heretofore been unable to meet the requirements of the above applications. Known external-cavity semiconductor lasers are standing-wave devices in which coherent optical radiation travels in two directions. These devices exhibit a phenomena known as "mode hopping" or "wavelength hopping" that is undesirable for the above laser applications. Two factors contribute to the presence of mode hopping.

First, a two-cavity situation occurs within a semiconductor laser because of non-zero facet reflectivities of the semiconductor material. Within the laser cavity, light is reflected between a laser facet and the mirrored surface of the external cavity. The semiconductor material itself, however, has inherent non-zero reflectivities and forms a second cavity within which the light reflects. This two-cavity situation makes it difficult to align the external-cavity standing-wave laser system for a variety of laser frequencies. Thus, when tuning occurs, mode hopping results and laser performance degrades due to a phase mismatch between the cavity of the semiconductor material facets and the cavity of the mirrored surface of the laser external cavity.

The other characteristic of standing-wave semiconductor laser systems that causes mode hopping and other performance instabilities is the presence of an intrinsic dielectric grating. The dielectric grating occurs because of the standing-wave. The result is a dielectric spatial perturbation that affects the output frequency. Because of the dielectric grating, the standing-wave semiconductor laser is more likely to exhibit optical instability. Moreover, the index change of the semiconductor material due to temperature and current fluctuation causes performance instability. This is because the semiconductor cavity significantly affects the operation of the device.

Consequently, there is a need for a wavelength-tunable semiconductor laser for a variety of applications including fiber optic communications, high-resolution spectroscopy, optical recording and optical readout, microwave and millimeter wave generation, and picosecond pulse generation, for fiber sensors.

There is a need for a laser that provides the above attributes in an economical package that is both simple to use and highly reliable.

Moreover, there is a need for an improved semiconductor laser that provides smooth wavelength tuning and narrow-linewidth, single-wavelength spectral characteristics.

Further, there is a need for a laser that avoids mode hopping during wavelength tuning and minimizes nonlinear gain to produce a more stable laser output during tuning and under steady state operations.

SUMMARY OF THE INVENTION

In accordance with these and many other objects, the subject invention includes a semiconductor ring-laser that satisfies the above objectives and overcomes the above-stated problems. In particular, the present invention provides a semiconductor ring-laser possessing high-power, tunable-wavelength, narrow-linewidth, single-wavelength characteristics usable in a variety of applications.

According to one aspect of the invention, there is provided a traveling-wave semiconductor ring-laser providing smooth wavelength tuning and improved performance stability that comprises a tilted-stripe semiconductor optical amplifier having a first facet and a second facet of low effective reflectivities. Within the laser, a portion of the laser light from the first facet is directed to the second facet by deflection from external mirrors. This creates a closed cavity in which lasing will occur. The invention further comprises an Faraday rotator, half-wave plate, and polarizing beamsplitter for directing the laser light to travel in only one direction from the first facet to the second facet. The invention further comprises a wavelength selective grating associated with the external mirrors that permits mechanical variation of the grating angle. Mechanical variation of the grating angle tunes the wavelength of the laser light. For single-wavelength operations, the laser system provides one additional beamsplitter to control the laser beam polarization. The result is a traveling-wave semiconductor ring laser that provides single-wavelength, narrow-linewidth, smooth wavelength tuning and improved performance stability.

A technical advantage of the present invention is that, because the ring-laser provides smooth wavelength-tunable characteristics and narrow-linewidth, single-wavelength spectral output, it has particular use in fiber optic communication applications and as a tool for high-resolution spectroscopic studies, as a local oscillator as in coherent optical communications, and as a coherent light source for testing optoelectronic devices.

Another technical advantage of the present invention is that because it has high-power and narrow-linewidth, it has particular use as a optical pump source for generating visible-wavelength light. This should improve performance in systems for optical recording and optical readout by providing a shorter wavelength light that has the ability for larger information storage capacity. In particular, the characteristics of the laser of the present invention provide an improved device for generating second harmonic radiation in the form of visible light.

Another technical advantage of the present invention is that its smooth tuning characteristics and performance stability make the semiconductor ring-laser an ideal device for generating high frequency microwave or millimeter wave signals by mixing lasing light from two lasers such as that described in the preferred embodiment. The performance stability and smooth tuning of the ring-laser of the present invention make it possible to generate a wide spectrum of microwave and millimeter wave signals for numerous applications.

Yet another technical advantage of the present invention is that because the device uses semiconductor laser technology, it provides the attributes of high-power, tunable-wavelength, narrow-linewidth single-wavelength performance more economically and reliably than many other types of tunable laser devices.

BRIEF DESCRIPTION OF THE DRAWINGS

The preferred embodiment of the present invention will be best understood by referring to the following detailed description and accompanying drawings in which:

FIGS. 7 and 8 are oscilloscope readings of the optical radiation that the laser system of a preferred embodiment produces to illustrate the single-wavelength and narrow-linewidth characteristics of the present invention.

DETAILED DESCRIPTION OF THE INVENTION

Figure 1:
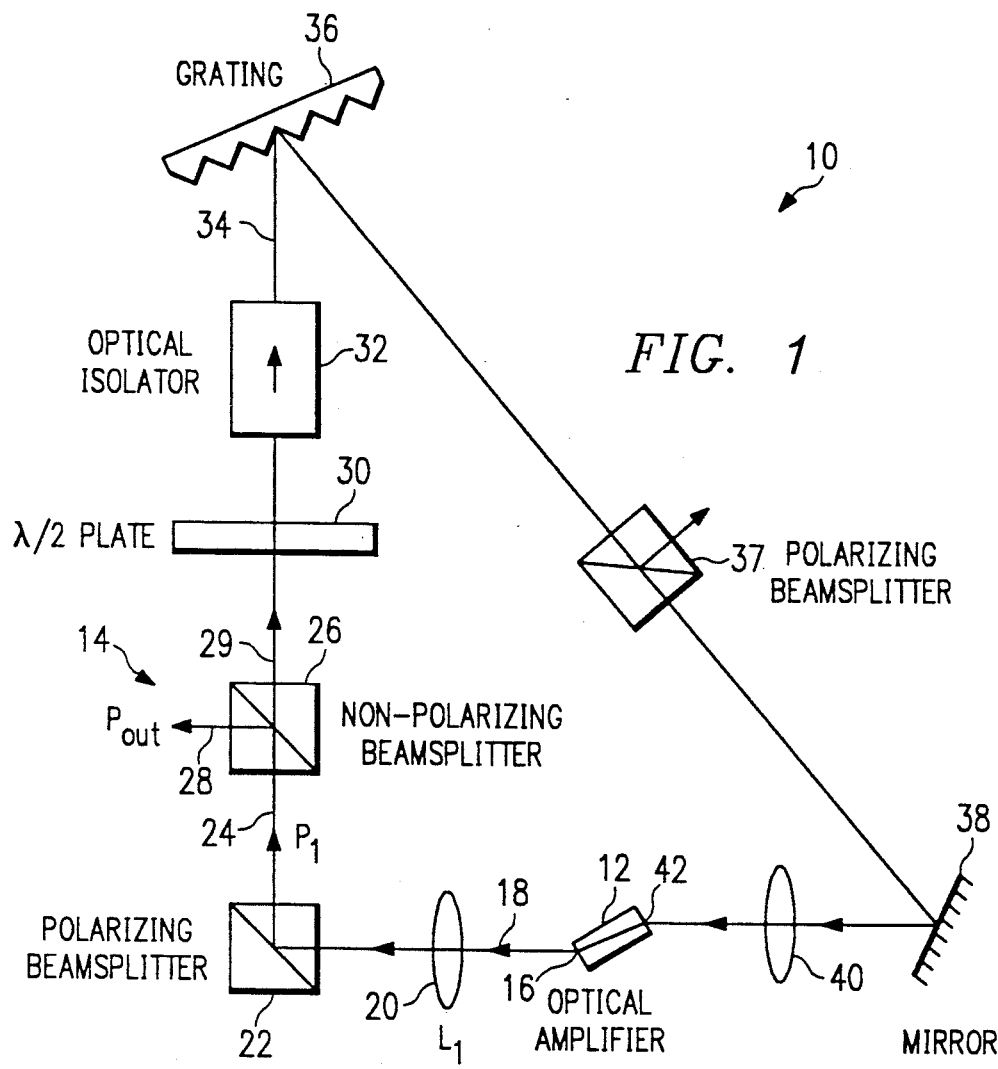
FIG. 1 is a schematic layout of a preferred embodiment of the traveling-wave semiconductor ring-laser of the present invention.

The wavelength-tunable traveling-wave semiconductor ring-laser 10 of the preferred embodiment is shown schematically in FIG. 1. Beginning at semiconductor optical amplifier 12 coherent optical radiation is generated which ultimately appears as a beam having output power $P_{out}$ 14. The laser system 10 output power 14 exhibits high-power, tunable-wavelength, narrow-linewidth, and single-wavelength characteristics. Laser system 10 operates as a traveling-wave device which means that the coherent optical radiation, or laser light, runs in one direction only.

To more particularly understand the preferred embodiment, FIG. 1 provides a schematic diagram of its fundamental components. Semiconductor optical amplifier 12 initially emits from facet 16 a non-lasing lightbeam 18 pointing in the direction of lens 20 that is directed to polarizing beamsplitter 22. Polarizing beamsplitter 22 causes only vertically polarized light to be extracted from lightbeam 18 to create lightbeam 24. Lightbeam 24 goes to nonpolarizing beamsplitter 26. All of the output light from polarizing beamsplitter 22 is vertically polarized. Nonpolarizing beamsplitter 26 splits the power of vertically polarized beam 24 into output power $P_{out}$ 14 beam 28 and directs the remaining portion as beam 29 into λ/2 plate 30. The λ/2 plate 30 rotates the polarization of beam 29 by 45° in the preferred embodiment. Faraday rotator 32 rotates polarization of lightbeam 29 back to vertical polarization as lightbeam 34. Lightbeam 34 reaches wavelength selective grating 36 and then travels to polarizing beamsplitter 37 where the residual non-vertically polarized portion of lightbeam 34 that leaves grating 36 is removed. From polarizing beamsplitter 37, lightbeam 34 travels to mirror 38, through lens 40 and into facet 42 of optical amplifier 12.

As optical amplifier 12 continues to provide gain, the vertically polarized portion of lightbeam 18 becomes increasingly strong, and the non-vertically polarized portion essentially disappears. As a result, optical resonance within optical amplifier 12 occurs and the laser system 10 operates as a high-power, traveling-wave, wavelength-tunable semiconductor laser. Faraday rotator 32 and λ/2 plate 30 cause any light reflected or emitted from facet 42 of optical amplifier 12 to be shifted in polarization by 90° as it passes through Faraday rotator 32 and λ/2 plate 30. As a result, the light goes back polarizing beamsplitter 22 as non-vertically polarized optical radiation. Polarizing beamsplitter 22, then causes the non-vertically polarized light to not be returned to optical amplifier 12. Consequently, only light traveling in the ring beginning at facet 16 and going to facet 42 of optical amplifier 12 is allowed. Semiconductor optical amplifier 12 is a "tilt-stripe" optical amplifier in the preferred embodiment. Although other types of optical amplifiers may be used with the present invention, the tilt-stripe configuration provides optimal results. Optical amplifier 12 provides low effective facet reflectivities at both facet 16 and facet 42. Use of the tilt-stripe configuration minimizes the need to provide a complex dielectric coating to minimize the facet reflectivities.

Although lasing will occur without the use of Faraday rotator 32, large fluctuations occur and the system 10 is inherently unstable. Upon introducing Faraday rotator 32 and λ/2 plate 30, however, light wave 34 travels in one direction, the fluctuations disappear, and the lasing power remains stable for a long period of time. In fact, one application of the preferred embodiment has been shown to remain stable for a period of at least eight hours (observation time).

The spot size of the laser beam of the embodiment is approximately 1.5 mm. Its frequency is tunable by grating 36. By mechanically varying the grating angle of grating 36, the wavelength may be tuned by approximately 40 nm.

For smooth wavelength tunability, in single-wavelength operation the preferred embodiment uses polarizing beamsplitter 37. The performance of optical isolator 32 and λ/2 plate 30 depend on the frequency that laser system 10 generates. Additionally, the lightbeam 34 emerging from grating 36 exhibits, at least to some degree, a shift in polarization. Depending on the shift in polarization the single-mode laser performance of the laser system 10 may degrade to produce a wider spectral linewidth. To avoid this situation, polarizing beamsplitter 37 eliminates from lightbeam 34 that portion of the lightbeam which no longer is vertically polarized and reflects the non-vertically polarized portion of lightbeam 34 outward away from the mirror 38 beampath. Removal of that portion which no longer is vertically polarized results in only minimal reduction in the lightbeam 34 power.

The following table describes the previously recited elements of FIG. 1 for the preferred embodiment and lists possible sources for each of the elements:

TABLE 1

| COMPONENT | MANUFACTURER |
| --- | --- |
| Optical Amplifier (InGaAsP 1.3 μm laser) 12 | GTE Laboratories |
| Lens (FL-40B) 20 | Newport Research |
| Polarizing Beamsplitter 22 | Mellis Griot |
| Non-polarizing Beamsplitter 24 | Newport Research |
| λ/2 Plate 30 | Optics for Research |
| Optical Isolator 32 | Optics for Research |
| Grating 36 | Instrument SA, Inc. |
| Polarizing Beamsplitter 37 | Mellis Griot |
| Mirror 38 | Newport Research |
| Lens (FL-20) 40 | Newport Research |

Figure 2:
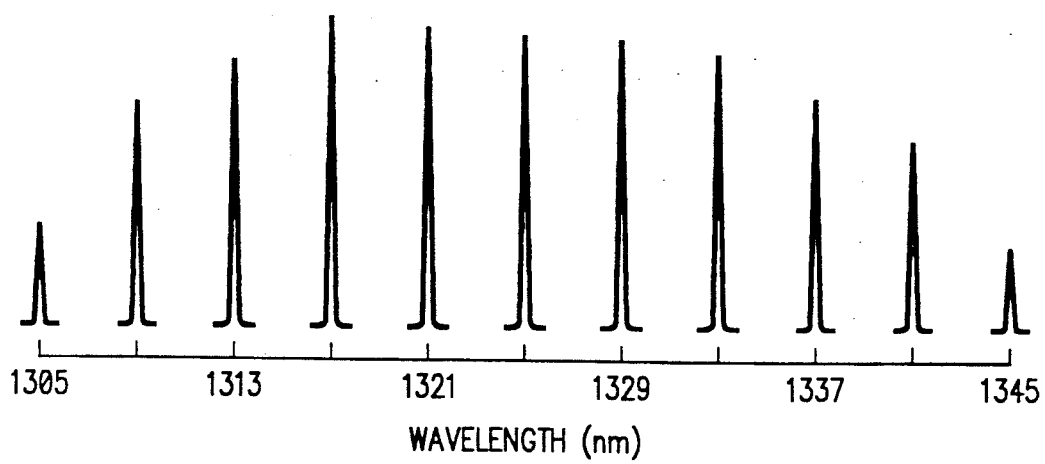
FIG. 2 shows the wavelengths at various grating positions within the tuning range of the preferred embodiment of the present invention.

FIG. 2 provides a plot of relative light wave intensity 44 for each grating position of the wavelength selective grating 36 within the 40 nm tuning range of 1305 to 1345 nm. The apparent spectral width is limited by the resolution of the measuring spectrometer, which is approximately 0.05 Å. The output power for $P_{out}$ 14 remains stable for a long period of time. The single wavelength and narrow-linewidth will be shown by a heterodyne measurement technique to be explained below at the text associated with FIGS. 7 and 8.

FIG. 2 illustrates that, as a result of mechanically varying the wavelength selectable grating 36 position, the wavelength of lightbeam 34 changes. The lightbeam 34 relative intensity, however, lowers as wavelength moves beyond the 1305 to 1345 nm tuning range. FIG. 2, therefore, illustrates that the gain from optical amplifier 12 is a function of the lightbeam 34 wavelength.

Figure 3:
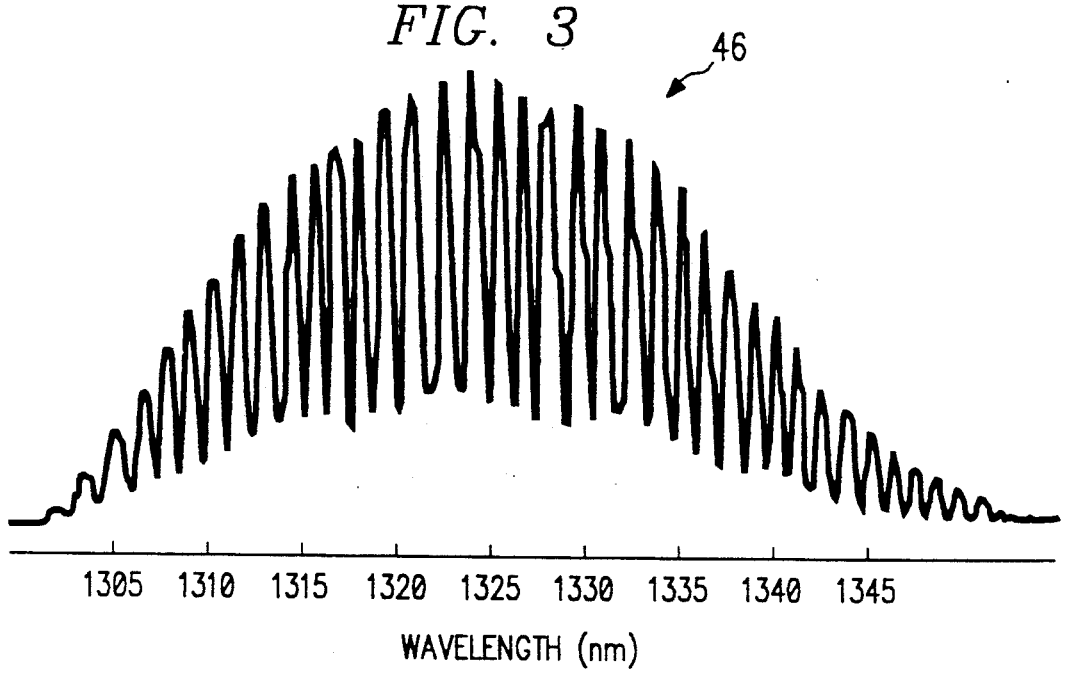
FIG. 3 illustrates the reflection intensity from an etalon of the optical radiation of the preferred embodiment as a function of wavelength for the purpose of showing the smooth wavelength tuning characteristics of the preferred embodiment.

FIG. 3 shows a plot of reflection intensity 46 from an etalon as a function of wavelength tuning. By coupling output light to an etalon, the measurement of FIG. 3 shows that the wavelength of the preferred embodiment is continuously tunable. Because the intensity that FIG. 3 shows continuously oscillates over the 40 nm tuning range it can be concluded that no wavelength hopping or mode hopping occurs over the lightbeam 34 tuning range.

Figure 4:
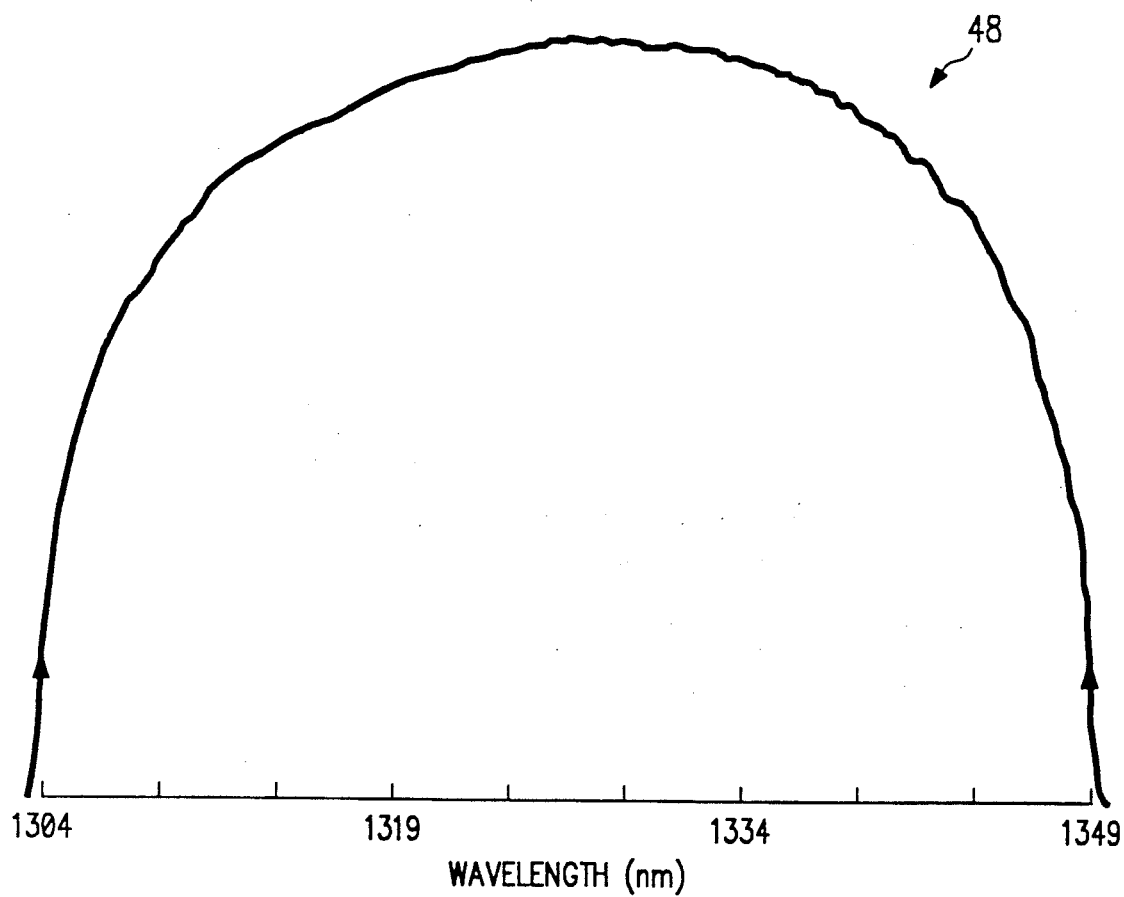
FIG. 4 shows a direct measurement of the output intensity of the preferred embodiment as a function of wavelength.

FIG. 4 even further illustrates the smooth tuning phenomenon by recording a direct measurement of the output intensity 48 of the preferred embodiment as a function of wavelength. The nearly semi-circular appearance of output intensity measurement 48 of FIG. 4 shows that no discontinuous change in intensity occurs. As a result, FIG. 4 further illustrates continuous tunability across the 40 nm output range. The preferred embodiment 10 of the present invention, therefore, has been shown to exhibit smooth wavelength tuning and power stability for applications such as use as a local oscillator, in fiber optic communication and for high-resolution spectroscopy, microwave and millimeter wave generation and harmonic conversion.

Figure 5:
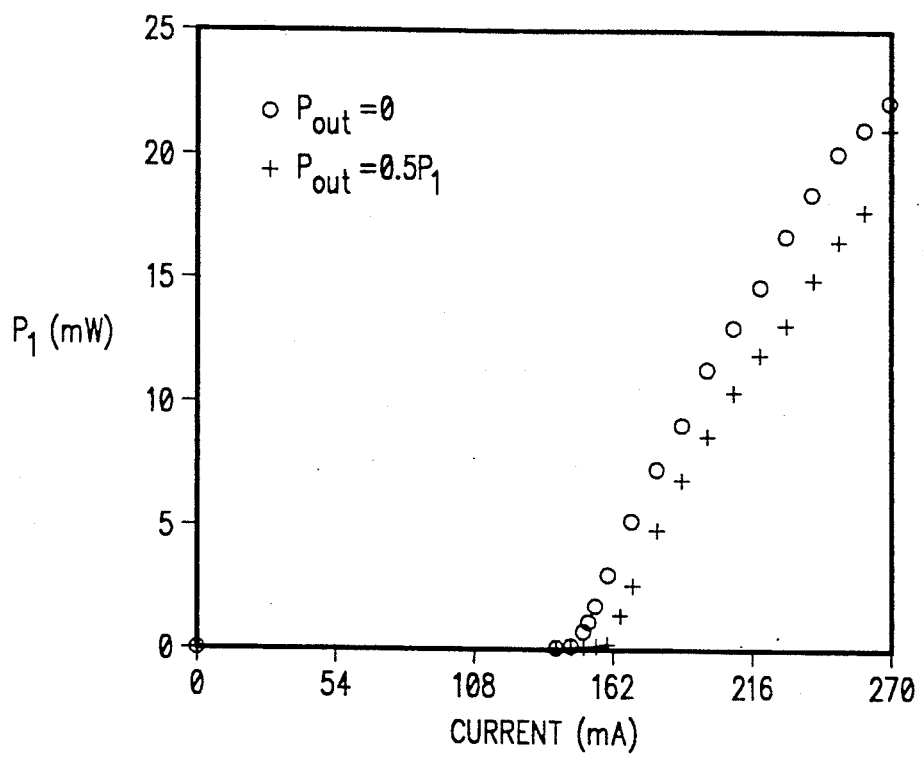
FIGS. 5 and 6 show measurements of internal power $P_1$ for two values of output power $P_{out}$ to illustrate characteristics regarding the relationship between $P_1$ and $P_{out}$.
Figure 6:
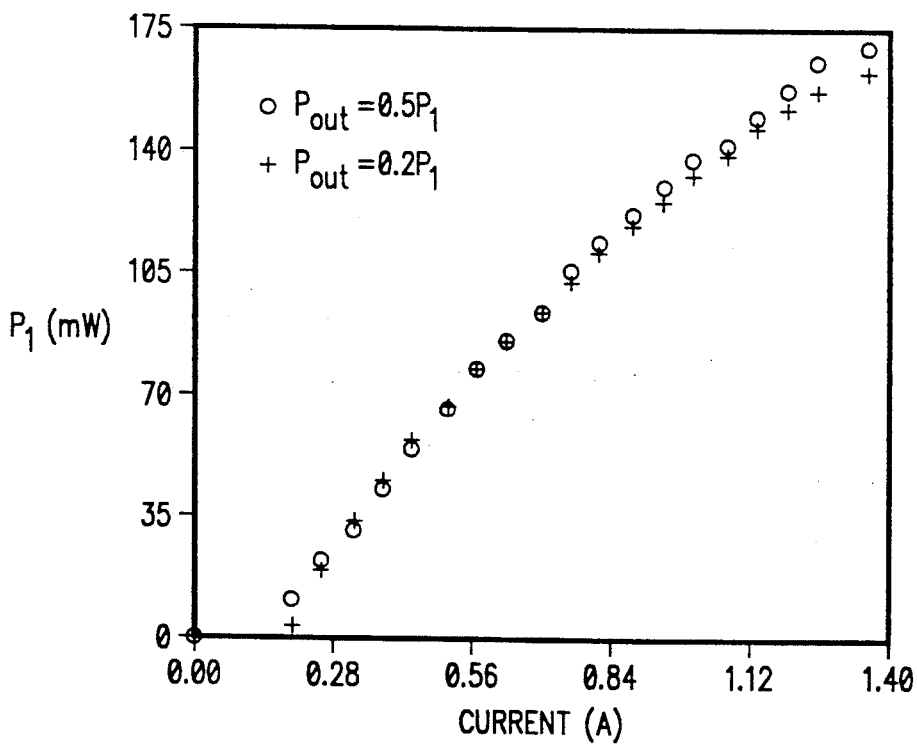

FIGS. 5 and 6 illustrate the results of investigations of the internal power $P_1$ of laser 10 as a function of coupled output power $P_{out}$. $P_1$ describes the power level at the output of the optical amplifier as indicated in FIG. 1. As the light beam traverses the ring in the clockwise direction, the power level decreases due to output coupling and other optical losses. However, $P_1$ remains practically constant and independent of the output coupling loss. The amount of output coupling loss is determined by the splitting ratio of non-polarizing beam splitter 26 of the preferred embodiment. In continuous wave (CW) operation, internal power $P_1$ is shown in FIG. 5 to range from 0 to 25 mW while current ranges from 140 to 270 mA. The plot of FIG. 5 shows two measurements of output power $P_{out} 14$: $P_{out}=0\cdot P_1(\circ)$ and $P_{out}=0.5\cdot P_1(+)$. FIG. 5 shows that as current ranges from approximately from 150 to 270 mA, $P_1$ ranges from 0 to 23 mW for the case of $P_{out}=0$. On the other hand, as current ranges from approximately 150 to 270 mA $P_1$ ranges from 0 to approximately 22 mW for $P_{out}=0.5\cdot P_1$. The output power is very similar. Thus, only a slightly higher threshold is observed for the case $P_{out}=0.5\cdot P_1$ than for $P_{out}=0\cdot P_1$. This indicates that $P_1$ is practically independent of $P_{out}$. This result is important, since it indicates that internal Power $P_1$ is practically independent of optical loss.

FIG. 6 provides similar results. In FIG. 6, $P_1$ ranges from 0 to 175 mW as current ranges from 0 to 1.4 A. FIG. 6, likewise, provides two plots of $P_1$ for the following cases: $P_{out}=0.2\cdot P_1(\circ)$ and $P_{out}=0.5\cdot P_1(+)$. FIG. 6 illustrates a long-pulse operation (no heating) of the preferred embodiment. According to FIG. 6, as current ranges from approximately 0.2 to 1.4 amps, $P_1$ ranges from 0 to 170 mW for the $P_{out}=0.5\cdot P_1$ case, and $P_1$ ranges from 0 to 165 mW for the $P_{out}=0.2\ P_1$ case. Thus, consistent with the results of FIG. 5, FIG. 6 shows that $P_1$ is practically independent of $P_{out}$. A qualitative explanation that $P_1$ does not change appreciably with $P_{out}$ relates the clamping of both the carrier density and the laser device gain at and above the laser threshold. Lasers with lower optical loss clamp at lower carrier densities and lower gain. Lasers with higher loss, however, clamp at higher carrier densities and higher gains. The higher gain compensates the higher optical coupling loss and $P_1$ remains practically constant.

A contributing factor to the phenomena that FIGS. 5 and 6 illustrate is the relationship described in the expression for $P_1$ which is given by the equation $$P_1 = \frac{h\nu}{q} \cdot \left( \frac{(1-\alpha_0)}{(1-x)+L\alpha_{loss}} \right) \cdot (I - I_{th}) \text{ with} \quad (1)$$

$$x = (1-\alpha_0)(1-\alpha_2)(1-\alpha_3)(1-\alpha_4) \quad (2)$$

where h is Planck's constant, v is the lasing frequency, q is electron charge, L is the length of the optical amplifier 12, I is current and $I_{th}$ is the threshold current. $\alpha_{loss}$ is the intrinsic optical loss of optical amplifier 12. The $\alpha_{loss}$ is measured to be about 23 cm$^{-1}$. The symbol $\alpha_o$ represents the percentage of optical loss due to the first collecting lens 20, $\alpha_2$ is the loss percentage from polarizing beamsplitter 22, $\alpha_3$ is the loss from non-polarizing beamsplitter 24, $\lambda/2$ plate 30, optical isolator 32, and grating 36, and $\alpha_4$ is the percentage of optical loss when light is coupled into the waveguide through facet 42 of optical amplifier 12. The value x is obtained by separate measurements of each $\alpha_i$, where each $\alpha_i$ is the optical loss due to the respective optical components of traveling-wave ring-laser system 10. In the preferred embodiment, $x=0.05$.

Equation (1) describes the power characteristics of traveling-wave semiconductor ring-laser system 10 of the preferred embodiment, equation (1) provides design guidelines for improving system performance. Moreover, the fact that $P_1$ is practically independent of $P_{out}$ may be understood by the numerical magnitude of parameters given in equation (1). For example, in the preferred embodiment, $\alpha_{loss}=23$ cm$^{-1}$, $L=0.1$ cm and $L\alpha_{loss}=2.3$ cm. With these magnitudes, equation (1) may be rewritten as equation (3) below without depreciable loss in accuracy.

$$P_1 \approx (h\nu/q) \cdot \left( \frac{1-\alpha_0}{1+L\alpha_{loss}} \right)(I - I_{th}) \quad (3)$$

Note that the above operation does not depend on x. Thus, $P_1$ is practically independent of output coupling loss $P_{loss} P_{out}$. Also, consequently, any change in x that various drifts in mechanical alignment cause do not significantly change $P_1$. Since $P_1$ is not affected by these changes, output power $P_{out}$ of the preferred embodiment exhibits stability over a wide range.

FIGS. 7 and 8 illustrate the application of a heterodyne technique for determining the linewidth of laser beam 34. The self-homodyne technique provides oscilloscope readings for output power $P_{out}$ 14 characteristic of the preferred embodiment. In both FIGS. 7 and 8, the scale is 500 kHz per division in the x direction and 10 dB per division in the y direction. Using the self-homodyne linewidth measurement technique, it is possible to obtain measurements of the very narrow-linewidth of laser beam from optical amplifier 12.

FIG. 7 shows that the linewidth is less than 160 kHz. The peak 60 of FIG. 7 is an instrumentation artifact. Using a weighted measure of the linewidth signal profile 62 of FIG. 7, it is possible to extrapolate the magnitude of the peak that would occur at point 64 if instrumentation peak 60 were not present. From the peak height it is possible to determine the 3 dB down point 66 from the peak height 64 and from that measurement determine the linewidth of lightbeam 28. As a result of the measurement that FIG. 7 indicates, it is highly probable that the linewidth of lightbeam 28 from optical amplifier 12 is less than 200 kHz. Further studies indicate that the linewidth of lightbeam 28 could be as low as 50 kHz. More research may precisely identify the exact linewidth of lightbeam 28 of the preferred embodiment.

FIG. 8 shows the side mode 68 of lightbeam 28. In laser system 10, the ring cavity allows an infinite number of longitudinal resonance modes. The frequency difference between the lasing main mode 62 and the side modes 68 may be determined by the total cavity length of the ring for laser system 10. In the preferred embodiment, however, the frequency difference measures approximately 500 MHz. FIGS. 7, 8 shows that only one mode is predominate in the resonance cavity, because the side mode is more than 10 dB down from the main mode. As a result, the traveling-wave laser system 10 of the preferred embodiment possesses the desired attribute of single-mode lasing.

The preferred embodiment of the present invention exhibits device characteristics desirable for fiber optic communications, high-resolution spectroscopy, optical recording and optical readout applications, microwave and millimeter wave generation applications, and picosecond pulse generation and fiber sensor applications. The device characteristics of the preferred embodiment are single wavelength with a linewidth of about 160 kHz within a 30 nm wavelength tuning range, excellent output power within a 45 nm wavelength tuning range, greater than 30 mW optical power output under CW operation, greater than 180 mW optical power under long-pulse operation, internal cavity power that is practically independent of couple output power, and excellent power stability. The linewidth may be maintained as low as 160 kHz for a tuning range of 30 nm. The beam diameter of the preferred embodiment is 1.5 mm, with a near-field spot size of approximately 5×0.2 μm². Moreover, the semiconductor laser of the present invention provides high-power, wavelength tunable, narrow-linewidth, single-wavelength spectral output much more economically than can known standing-wave external-cavity laser systems.

A unique feature of the traveling-wave laser system 10 of the preferred embodiment is the ability to change optical amplifier components with ease. For example, instead of a 1.3 μm wavelength optical amplifier 12, a 1.55 μm or a 0.8 μm wavelength optical amplifier may be used. Moreover, optical amplifier 12 can be easily substituted by an optical amplifier with a quantum-well structure. In such a case, the expected wavelength tuning range may be more than 200 nm.

For generating second harmonic radiation with the laser system of the present invention, a nonlinear crystal may be placed in the position of the non-polarizing beamsplitter 26. As explained in connection with FIGS. 5 and 6 above, internal power $P_1$ is almost independent of the output power $P_{out}$. Therefore, optical loss due to second harmonic conversion is minimal. This provides the ability to generate visible wavelength light by optically pumping a solid state material such as Potassium Niobate ($KNbO_3$). The generation of visible wavelength light in this fashion has significant commercial applications such as optical recording and optical readout operations of laser scanners (e.g., such as those found in supermarket check-out lanes). Moreover, the improved smooth wavelength tuning and stability that the present invention offers should provide a foundation for further research and development in solid state laser emission of visible wavelength light.

Another particularly attractive feature of the laser system 10 pertains to radio frequency and millimeter wave signal generation. Because of the preferred embodiment's narrow-linewidth, continuous wavelength tuning, and stability characteristics, the semiconductor laser system 10 of the present invention provides the ability to expand radio frequency generation up and into to the multi-GHz range easily and efficiently.

Also, because of the traveling-wave nature of laser system 10 of the preferred embodiment, nonlinear gain may be minimized for systems employing the device. Laser system 10 of the preferred embodiment utilizes a traveling-wave method of generating optical radiation, that eliminates the dielectric grating that is characteristic of standing-wave laser systems. Elimination of dielectric grating avoids gain nonlinearity during short pulse production. As a result, the laser system 10 of the preferred embodiment may have significant application in generating picosecond pulses for high speed oscilloscope sampling applications.

Because of the long external cavity compared with the optical amplifier chip length of 0.1 cm, the performance instability caused by the index change of the semiconductor material due to temperature and current fluctuation is considerably less than that of standing-wave laser systems. This important feature can be used advantageously for fine tuning the wavelength of the laser. For example, a 1° C. change in temperature causes frequency to shift by approximately 30 MHz. A 1 mA change in current causes frequency to shift by less than 1 MHz.

In summary, the preferred embodiment of the present invention illustrates a traveling-wave, high-power, wavelength-tunable, narrow-linewidth, single-wavelength, semiconductor ring-laser system 10 which avoids mode hopping during wavelength tuning and exhibits performance stability.

The preferred embodiment of the present invention has been described in detail. However, it will be appreciated that those skilled in the art, upon consideration of the present disclosure, may make modifications and improvements of this invention and still be within the scope and spirit of this invention as set forth in the following claims.

What is claimed is:

1. A traveling-wave ring-laser, comprising:
   a semiconductor optical amplifier having a first facet and a second facet for generating a low-linewidth continuous wave laser light from said first facet to said second facet in a single longitudinal mode of operation;
   means for communicating a portion of said laser light between said first facet and said second facet;
   means for directing said portion of said laser light to travel in one direction from said first facet to said second facet, thereby providing stability of said laser light from said semiconductor optical amplifier.

2. The traveling-wave ring-laser of claim 1, wherein said means for directing said laser light to travel in one direction comprises:
   a half-wave plate for shifting the polarization of said laser light by a predetermined amount;
   an Faraday rotator associated to receive said polarization-shifted laser light from said half-wave plate for returning said laser light to the polarization existing prior to said laser light entering said half-wave plate, said Faraday rotator and half-wave plate further associated to receive light emitted from said second facet and cumulatively shift said emitted laser light; and
   means for preventing said cumulatively shifted emitted laser light from reaching said first facet of said semiconductor optical amplifier.

3. The laser of claim 1, further comprising a wavelength selective grating associated with said communicating means, said grating having a mechanically adjustable grating angle for tuning the wavelength of said laser light.

4. The laser of claim 1, further having an internal power $P_1$ associated with said optical amplifier and an output power, and wherein said internal $P_1$ coupling loss is essentially independent of said output coupling loss.

5. The laser of claim 4, wherein said internal power, $P_1$, appears approximately according to the following relationship:

$$P_1 \approx (hv/q) \cdot \left( \frac{1 - \alpha_0}{1 + L\alpha_{loss}} \right) \cdot (I - I_{th})$$

where h is Planck's constant, v is the lasing frequency of free space, q is electron charge, L is the length of said optical amplifier I is current and $I_{th}$ is the threshold current, $\alpha_o$ represents percentage optical loss, within said laser, and the symbol $\alpha_{loss}$ represents intrinsic optical loss of said optical amplifier.

6. The laser of claim 4, wherein said internal power $P_1$ reaches approximately 175 milliWatts at a long-pulse current of approximately 1.4 amps.

7. The laser of claim 4, wherein said laser light provides continuous power during wavelength tuning, and said internal power reaches a value of approximately 23 milliwatts for a current of approximately 270 milliamps.

8. The laser of claim 1, wherein said laser lases in a linewidth of not more than 160 kilohertz.

9. The laser of claim 1, further comprising a nonlinear crystal associated to receive said laser light for generating second harmonic radiation.

10. The laser of claim 1, wherein said laser light producing material comprises an optical amplifier.

11. The laser of claim 10, wherein said optical amplifier comprises a semiconductor material.

12. The laser of claim 10, wherein said optical amplifier comprises a fiber optic material.

13. The laser of claim 10, wherein said optical amplifier comprises tilt-stripe optical amplifier for reducing the reflectivity of said first facet and said second facet.

14. The laser of claim 10, wherein said optical amplifier comprises a 1.3 $\mu$m semiconductor optical amplifier.

15. The laser of claim 10, wherein said optical amplifier comprises a 1.55 $\mu$m semiconductor optical amplifier.

16. The laser of claim 10, wherein said optical amplifier comprises a 0.8 $\mu$m semiconductor optical amplifier.

17. A method for producing stable traveling-wave coherent optical radiation, comprising the steps of:
generating low line-width continuous wave laser light in a single longitudinal mode of operation from a first facet of a semiconductor optical amplifier having said first facet and a second facet;
communicating a portion of said laser light from said first facet to said second facet;
directing said portion of said laser light to travel in one direction only from said first facet to said second facet.

18. The method of claim 17, wherein said directing step comprises the steps of:
shifting said laser light from said first facet polarization by a predetermined amount;
receiving said polarization-shifted laser light and returning said laser light polarization to the polarization existing prior to said shifting step;
receiving laser light reflected from second facet and cumulatively shifting said reflected laser light polarization; and
preventing said cumulatively-shifted reflected laser light from reaching said first facet.

19. The method of claim 17, further comprising the step of tuning the wavelength of said laser light using a wavelength selective grating.

20. The method of claim 17, further comprising the step of generating second harmonic radiation from said coherent optical radiation by receiving said coherent optical radiation with a nonlinear crystal.

21. A traveling-wave ring-laser system having improved output power stability, comprising:
a semiconductor optical amplifier having a first facet and a second facet for generating low line-width continuous wave laser light from said first facet said optical amplifier for operating in a single longitudinal mode;
means for outputting a first predetermined portion of said laser light from said system;
means for communicating a second predetermined portion of said laser light from said first facet to said second facet and;
means for directing a second predetermined portion of said laser light to travel in one direction only from said first facet to said second facet.

22. The system of claim 21, further comprising a wavelength selective grating associated with communicating means, said grating having a mechanically varying grating angle for tuning the wavelength of said laser light.

23. The system of claim 22, wherein said optical amplifier has an active area of approximately 5×0.2 $\mu m^2$.

24. The system of claim 21, further having an internal power associated with said optical amplifier and wherein said internal power is practically independent of the ring-laser system output coupling loss $P_{out}$.

25. A high frequency wave generation system for generating a radio frequency signal, said radio frequency generation system comprising:
two laser light sources, at least one of said laser light sources comprising a traveling wave ring-laser said ring-laser comprising:
an optical amplifier having a first facet and a second facet for generating laser light from said first facet;
means for directing a portion of said laser light from said first facet to said second facet; and
means for directing said portion of said laser light to travel in one direction only from said first facet to said second facet.

26. The high frequency wave system of claim 25, wherein said high frequency generating system produces a microwave signal.

27. The high frequency wave system of claim 25, wherein said high frequency comprises a millimeter wave frequency.

28. The high frequency wave generation system of claim 25, further comprising a wavelength selective grating associated with said communicating means, said grating having a mechanical varying grating angle for tuning the wavelength of said laser light.

29. The high frequency generation system of claim 25, wherein said traveling-wave ring laser has an internal coupling loss associated with said optical amplifier and an output coupling loss and wherein said internal coupling loss is practically independent of said output power.

30. A system for generating visible wavelength light from an infrared semiconductor laser by optically stimulating a solid state material, comprising:
a solid state material;
a traveling-wave ring-laser, comprising:
a semiconductor optical amplifier having a first facet and a second facet for generating low line-width continuous wave laser light from said first facet in a single longitudinal mode;
means for directing a portion of said laser light from said first facet to said second facet;
means for directing said portion of said laser light to travel in one direction only from said first facet to said second facet; and
a non-linear crystal associated to receive said laser light from said first facet and outputting therefrom harmonic radiation in the form of visible light.

* * * * *